(12) United States Patent
Stuart

(10) Patent No.: US 10,224,950 B2
(45) Date of Patent: Mar. 5, 2019

(54) DIGITAL TO ANALOGUE CONVERSION

(71) Applicants: MQA LIMITED, Cambridgeshire (GB); REINET S.À.R.L., Prince Henri (LU)

(72) Inventor: John Robert Stuart, Cambridge (GB)

(73) Assignee: REINET S.À.R.L., Luxembourg (LU)

( * ) Notice: Subject to any disclaimer, the term of this patent is extended or adjusted under 35 U.S.C. 154(b) by 0 days.

(21) Appl. No.: 15/577,637

(22) PCT Filed: May 26, 2016

(86) PCT No.: PCT/GB2016/051534
§ 371 (c)(1),
(2) Date: Nov. 28, 2017

(87) PCT Pub. No.: WO2016/193677
PCT Pub. Date: Dec. 8, 2016

(65) Prior Publication Data
US 2018/0167081 A1 Jun. 14, 2018

(30) Foreign Application Priority Data

May 29, 2015 (GB) .................................. 1509325.5

(51) Int. Cl.
*H03M 1/06* (2006.01)
*H03M 1/66* (2006.01)
*H03M 3/04* (2006.01)

(52) U.S. Cl.
CPC ......... *H03M 1/661* (2013.01); *H03M 1/0639* (2013.01); *H03M 3/04* (2013.01); *H03M 1/068* (2013.01); *H03M 2201/6178* (2013.01)

(58) Field of Classification Search
CPC ...... H03M 1/661; H03M 3/04; H03M 1/0639; H03M 2201/6178; H03M 1/068
(Continued)

(56) References Cited

U.S. PATENT DOCUMENTS

| 4,864,305 A | 9/1989 | Toyama |
| 4,897,654 A | 1/1990 | Mod et al. |

(Continued)

FOREIGN PATENT DOCUMENTS

| EP | 0369630 A2 | 5/1990 |
| GB | 2250148 A | 5/1992 |
| JP | H0362733 A | 3/1991 |

OTHER PUBLICATIONS

"Patents Act 1977: Combined Search and Examination Report under Sections 17 and 18(3)", GB Intellectual Property Office, Nov. 23, 2015, GB Application No. 1509325.5, 4 pages.
(Continued)

*Primary Examiner* — Khai M Nguyen
(74) *Attorney, Agent, or Firm* — Buckley, Maschoff & Talwalkar LLC

(57) ABSTRACT

Devices and methods for digital to analog conversion (DAC) are provided, in which the analog outputs of an even number of digital to analog converters are combined. The individual converters operate on the same data but there is a relative time delay between the input digital signal received by one or more of the converters and the input digital signal received by other of the converters, wherein the delay is a fraction of the data sample period. Moreover, the data signal fed to half of the converters has an inverse relationship with the data signal fed to the other half of the converters and their analog outputs are subtracted. Dither and filtering techniques may also be employed.

21 Claims, 11 Drawing Sheets

(58) Field of Classification Search
USPC .................................. 341/118, 131, 144
See application file for complete search history.

(56) References Cited

U.S. PATENT DOCUMENTS

| | | | | |
|---|---|---|---|---|
| 5,073,778 | A * | 12/1991 | Ueki | H04B 14/046 |
| | | | | 341/131 |
| 7,812,751 | B2 * | 10/2010 | Eloranta | H03M 1/745 |
| | | | | 341/136 |
| 9,007,250 | B1 | 4/2015 | Jeraj et al. | |
| 2005/0225464 | A1 | 10/2005 | Lin et al. | |
| 2010/0097253 | A1 | 4/2010 | Mu | |
| 2012/0194373 | A1 | 8/2012 | Steinbach | |
| 2013/0234873 | A1 | 9/2013 | Wyville | |

OTHER PUBLICATIONS

"PCT Written Opinion" of the International Searching Authority for Application No. PCT/GB2016/051534, dated Aug. 22, 2016 (Aug. 22, 2016), 8 pages.
"PCT International Search Report", International Searching Authority, for PCT/GB2016/051534, dated Aug. 22, 2016 (Aug. 22, 2016), 6 pp.

* cited by examiner

DIGITAL TO ANALOGUE CONVERSION

CROSS-REFERENCE TO RELATED APPLICATION

This application is a U.S. National Stage filing under 35 U.S.C. § 371 and 35 U.S.C § 119, based on and claiming priority to PCT/GB2016/051534 for "DIGITAL TO ANALOGUE CONVERSION" filed May 26, 2016 claiming priority to GB Patent Application No. 1509325.5 filed May 29, 2015.

FIELD OF THE INVENTION

The present invention relates to improvements in digital-to-analogue converters, and their application to high-quality audio in particular.

BACKGROUND OF THE INVENTION

The Digital-to-Analogue converter (DAC) finds wide application in electronics and functions to convert digital data into an analogue signal, which is the reverse function of the Analogue-to-Digital converter (ADC). Although typically requiring more complex equipment, digital data can be stored, transmitted and manipulated with minimal degradation as compared to analogue signals. It is therefore common to convert analogue signals to digital data in order to benefit from this. However, for many applications, the digital data must ultimately be converted back to an analogue signal for end use.

A particular example is in the transmission and processing of audio signals. Sound waves from an original source may be captured by a microphone device and converted to an analogue electrical signal. Using an ADC, this can then be converted to a digital stream, which can be stored, transmitted or otherwise processed. However, a DAC is then required to convert the digital signal to an analogue electrical signal for driving an earphone or loudspeaker amplifier to produce actual sound (air pressure waves).

Various formats exist for storing and transmitting digital data according to the particular application. For example, a common format used to store video and audio data is MPEG-4, which is a digital multimedia format that allows streaming over the internet.

Another common format for high quality audio is pulse code modulation (PCM), which relates to a method for digitally representing sampled analogue audio signals. In this format, the analogue signal is sampled at uniform intervals and each sample is quantised to the nearest value within a range of digital steps. The resulting PCM stream is characterised by a sampling rate, which is the number of times per second the original audio signal is sampled, and the bit depth, which determines the number of possible digital values that can be used to represent each sample.

Digital-to-Analogue converters (DACs) can be realised in a number of ways. For linear PCM (LPCM) two architectures have commonly been used, namely: a) flash conversion where a digital word is converted to an analogue output directly at the sampling rate, and b) oversampling converters, which have become most common in integrated converters for audio.

FIG. 1 illustrates the internal block diagram of a typical oversampling integrated-circuit Digital-to-Analogue converter (DAC) 10. The input PCM stream 11 is first upsampled by an upsampling filter 12. Conversion then takes place in a high-speed delta-sigma modulator 13 feeding a DAC 14 to provide the output analogue signal 15.

The modulator operates on a narrow-word (3 to 8 bits) up-sampled PCM stream, often at a rate between 3 to 13 MHz. Commonly, the modulator 13 will run at an integer multiple of the incoming data rate. This modulator architecture is chosen because it is efficient to integrate on silicon. In a practical device, the analogue output of the modulator may be single-ended or balanced, current or voltage sources. Incoming linear PCM data for audio may commonly use sample rates in the range 32-384 kHz with precision in the range 16-32 bits.

In FIG. 1 we see that there is an interpolation upsampling filter structure 12 matching the rate of the incoming PCM signal 11 to that of the modulator 13. For integration efficiency the interpolation structure often takes the form of a multistage cascade of filters performing the up-sampling process in a series of steps. The sampling rates so interpolated in this structure may or may not have an integer relationship.

For designs intended for very high-performance, the cascaded interpolation filters can present limitations. For example, these may include one or more of the following: the form of the convolved impulse response of the cascaded filters; frequency response ripple; aliasing errors; quantisation noise and quantisation distortion through inadequate dithering of the filter or modulator stages. For these reasons, even where proportionally high-frequency content is not present relative to the Nyquist frequency, higher audio sample rates such as 96, 192 or 384 kHz, which reduce the number of interpolation stages, can result in superior sound.

Some converters intended for high performance allow direct input to the modulator, and in these cases rely on a signal which is already suitably up-sampled, dithered and quantised, which requires significant computational resource. Generally, economic considerations result in most applications using integrated filters.

A product designer who wishes to extract higher sound quality can take relatively simpler steps to ameliorate some properties of the upsampling filters and modulator. Such application improvements include preceding the converter with a so-called 'apodising' filter which is arranged to have a sub-Nyquist frequency transmission null, so as to prevent pre- and/or post-ringing on a transient. This type of filter is described in Craven, P. G., 'Antialias Filters and System Transient Response at High Sample Rates', *J. Audio Eng. Soc.*, Vol. 52, No. 3, pp. 216-242, (March 2004).

The performance of a reproducing chain may also be improved by incorporating the DAC, its analogue and digital filters into a hierarchical scheme in which some or all of the upsampling stages can be performed in a cascade of simple stages based on triangular or B-spline kernels. This approach is described in Stuart, J. R., Craven, P. G., 'A Hierarchical Approach to Archiving and Distribution', 137$^{th}$ *AES Convention,* Los Angeles (October 2014). For example, such a cascade may use a simple triangle kernel for filter upsampling a signal from 192 kHz to 384 kHz, as described in Pohl, V., Yang, F., Boche, H., 'Causal Reconstruction Kernels for Consistent Signal Recovery', *EUSIPCO*, Bucharest, pp. 1174-1178, (2012).

One limitation to implementing systems based on the hierarchy of B-spline and/or triangular kernels is that available integrated devices may be limited to incoming data rates such as 96 or 192 kHz, thereby limiting the chain length, as noted by Stuart, J. R. and Craven, P. G. in 'A Hierarchical Approach to Archiving and Distribution', 137$^{th}$ *AES Convention*, Los Angeles (October 2014).

Applications seeking high-quality sound may also use dither or add a similar low-level uncorrelated noise to the incoming signal, at a level somewhat higher than the least-significant bit (LSB), to mask the subjective effects of quantisation errors in the integrated converter. Such a noise signal may be spectrally shaped to minimise its audibility.

Some examples of noise shaping and use of dither are described in Widrow, B., Kollár, I., *Quantization Noise: Roundoff Error in Digital Computation, Signal Processing, Control, and Communications*, CUP, Cambridge, UK, ISBN: 0521886716 (2008), also in Gerzon, M. A., Craven, P. G., Stuart, J. R., and Wilson, R. J., 'Psychoacoustic Noise Shaped Improvements in CD and Other Linear Digital Media', *AES 94th Convention*, Berlin, preprint 3501 (March 1993), and finally in Stuart, J. R., and Wilson, R. J., 'Dynamic Range Enhancement using Noise-Shaped Dither at 44.1, 48 and 96 kHz', *AES 100th Convention*, Copenhagen (1996).

Other performance limitations in an integrated-circuit DAC include thermal noise and non-linearity arising in the analogue stages. The signal-to-noise ratio can be improved by up to 3 dB by using two identically-driven DACs whose outputs are summed in the analogue domain (so-called 'mono mode'). In a further refinement, by arranging for the input signals to the two converters to be inversely related and for the analogue signals to be subtracted, even-order non-linear distortion can be reduced by partial cancellation.

However, notwithstanding the developments described above, there remains a need for improved digital-to-analogue converter devices, which address the problems prevalent in more conventional DAC devices. This is particularly true for applications involving high quality sound.

SUMMARY OF THE INVENTION

According to a first aspect of the present invention there is provided a digital-to-analogue converter (DAC) device comprising:

- an input for receiving a digital signal having a data sample rate Fs and a sample period 1/Fs;
- N digital-to-analogue converters (DACs) coupled to the input for receiving the digital signal, where N is an even integer and N≥2;
- an inverter coupled to the input and to half of the N DACs, whereby the input digital signal received by said half of the N DACs is inverted relative to the input digital signal received by the other half of the N DACs;
- a delay unit coupled to the input and configured to introduce a relative time delay between the input digital signal received by one or more of the N DACs and the input digital signal received by other of the N DACs, wherein the relative time delay is a fraction of the sample period 1/Fs of the digital signal; and,
- a combiner coupled to the N DACs and configured to combine subtractively the analogue outputs of said half of the N DACS with the analogue outputs of said other half of the N DACs to provide an output analogue signal.

In this way overall device performance can be improved by combining the analogue outputs of a number of DAC devices, wherein the individual converters operate on the same data but have specific time offsets relative to at least some of the other converters that are a non-zero fraction of the data sample period. The relatively-delayed input of the same digital signal to the N DACs is beneficial in effectively increasing the number of reconstruction points from which the analogue signal is reconstructed. Moreover, the data signal fed to half of the converters has an inverse relationship with the data signal fed to the other half of the converters and their analogue outputs are subtracted, whereby analogue non-linear distortion may be reduced by cancellation.

The device may employ discrete DACs or else may be a single integrated-circuit device. Similarly the device may be implemented using flash or oversampling DACs according to the application.

Preferably, the N DACs are substantially identical to one another, thereby providing matched responses from the DACs and making it easier to combine their outputs in the desired manner.

In some embodiments, the relative time delays between the input digital signals received by each of DACs may be chosen to provide a predetermined impulse response for the device. In this way the DAC device can be configured to provide a particular desired impulse response.

In some preferred embodiments, the relative time delay between the input digital signal received by said half of the N DACs and the input digital signal received said other half of the N DACs is 1/(2×Fs). In this way, half of the DACs are delayed by half a sample period of the incoming signal relative to the other half of the DACs, thereby effectively doubling the number of reconstruction points.

In other preferred embodiments, the relative time delay between the input digital signals received by each of said half of the N DACs is different and is delayed by 1/(2×Fs) relative to the input digital signals received by corresponding DACs in said other half of the N DACs.

In other preferred embodiments, the relative time delay between the input digital signal received by said half of the N DACs and the input digital signal received said other half of the N DACs is 1/(N×Fs). In this way, half of the DACs are delayed by 1/N of a sample period of the incoming signal relative to the other half of the DACs.

In other preferred embodiments, the relative time delay between the input digital signals received by each of said half of the N DACs is different and is delayed by 1/(N×Fs) relative to the input digital signals received by corresponding DACs in said other half of the N DACs.

In some embodiments, at least one DAC has no other DAC with the same time delay from the input digital signal In addition, the delayed DACs need not be operating in the same signal phase, as it may be advantageous for the earlier and later pairs of DACs to operate differentially to achieve more cancellation of high-frequency noise.

In some further preferred embodiments the DAC device further comprises a dither unit coupled to the input and the N DACs, wherein the dither unit is configured to generate a random dither signal for adding to the input digital signal received by each of the N DACs in a common mode. This amplitude dither signal will tend to cancel in the analogue domain, but its presence within each DAC can improve linearity and cause lower modulation noise errors to be introduced in the overall result.

In some embodiments the dither signal is a shaped dither signal. Typically the dither signal will comprise two or more least significant bits (LSBs).

In some embodiments the dither signal is generated at a rate higher than the sample rate of the input digital signal. The dither signal may be generated by upsampling a lower rate dither sequence. This is more computationally efficient than generating directly at the higher rate. Moreover, the dither signal may be generated at a reconstruction rate of the output analogue signal and is fed to each set of DACs in sequence so that the analogue cancellation of dither noise is not diminished by the relative time offsets.

In other embodiments, the input digital signal is noise shaped so as to contain less energy at higher frequencies, which can ameliorate the loss of high-frequency-cancellation resulting from delayed differencing.

Thus, the invention allows for dither to be used so that linearity can be optimised without over-penalising the output noise floor. The invention also allows for these dither signals to be derived from a higher-rate stream or to use delay methods to maximise analogue cancellation at high frequencies.

In some embodiments of the DAC device, the combiner is configured to combine the analogue outputs of each of the N DACs with an applied weighting, which may be the same for each analogue output. Alternatively, the applied weighting may be different for at least two of the N DACs. In some preferred embodiments, the applied weighting is dependent on the relative time delay of the input digital signal received by each respective DAC, and can be configured to modify the frequency response of the device.

Although the DAC device of the present invention can be used with a wide range of digital signals conveying different data, it is particularly applicable to digital signals comprising a digital audio signal, which may be a pulse code modulated (PCM) signal. The device is well suited to applications involving high quality audio, as noise or signal distortion often associated with digital to analogue conversion may be significantly mitigated.

According to a second aspect of the present invention there is provided a method for converting a digital signal to an analogue signal, the method comprising the steps of:
  receiving the digital signal having a data sample rate Fs and a sample period 1/Fs;
  feeding the digital signal to N digital-to-analogue converters (DACs), wherein N is an even integer and N≥2, such that the input digital signal received by half of the N DACs is inverted relative to the input digital signal received by the other half of the N DACs and such that there is a relative time delay between the input digital signal received by one or more of the N DACs and the input digital signal received by other of the N DACs, wherein N is an integer and N≥2, and wherein the relative time delay is a fraction of the sample period 1/Fs of the digital signal; and,
  combining subtractively the analogue outputs of said half of the N DACS with the analogue outputs of said other half of the N DACs to provide the output analogue signal.

In various embodiments, the method of the second aspect may reflect many of the embodiments of the device of the first aspect of the invention in terms of additional method steps.

As will be appreciated by those skilled in the art, the present invention provides new types of digital to analogue conversion devices, whose precise implementation can be adapted according to the particular design and application. Further variations and embellishments will become apparent to the skilled person in light of this disclosure.

BRIEF DESCRIPTION OF THE DRAWINGS

Examples of the present invention will now be described in detail with reference to the accompanying drawings, in which.

DETAILED DESCRIPTION

As will be described, the present invention provides a new composite Digital-to-Analogue Converter (DAC) device, in which two or more DACs are combined in various configurations with relative time delays that are a non-zero fraction of a sample period of the digital signal to be converted. The delays may be implemented by a single delay unit or by multiple delay units. Typically, the data streams and clocks are both delayed for a given DAC.

Figure 1:
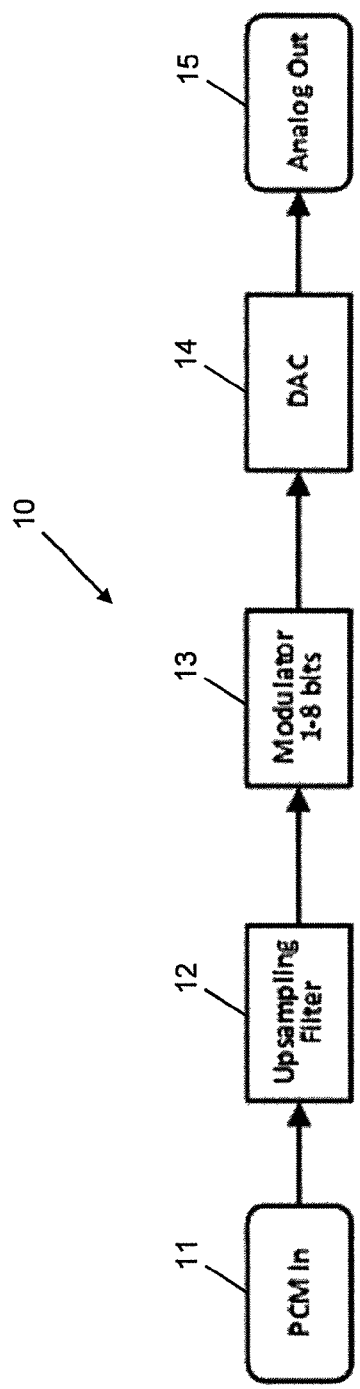
FIG. 1 shows a schematic block diagram of the internal functions in a typical oversampling integrated-circuit DAC.

The DAC device may be implemented in a range of different architectures, including a flash DAC or an oversampling integrated-circuit DAC of the type shown in FIG. 1. Multiple such DACs may be combined in an array with suitable time delays or else within such an integrated-circuit DAC.

Figure 2:
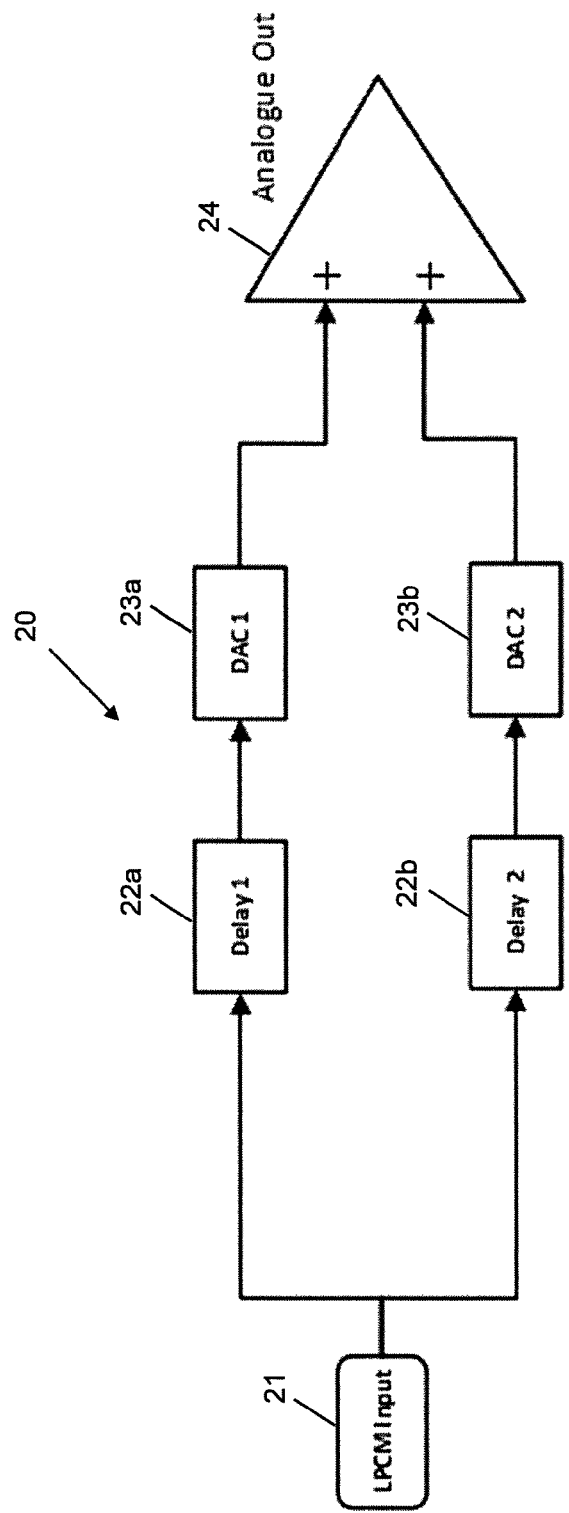
FIG. 2 shows a schematic block diagram of an arrangement in which two DACs operating on a common input are relatively delayed and their output combined additively.

FIG. 2 shows a simple arrangement in which two similar DACs, 23a and 23b, are combined in a single conversion system so that their analogue outputs are combined additively 24 to produce the final analogue output signal. Both DACs operate on a single incoming data stream 21 at Fs rate, with samples separated in time by 1/Fs. However, the signal to each DAC is delayed by a different amount. As indicated the incoming data stream may be a linear pulse code modulation (LPCM) signal.

In some implementations Delay1 22a may be zero whereas Delay2 22b might be 1/(2×Fs). In this case, there is a relative delay, or difference in delay, equal to (Delay2−Delay1)=1/(2×Fs), and the data and clocks for one DAC are delayed by a half-sample period relative to the other DAC, thereby effectively doubling the number of reconstruction points.

Figure 3:
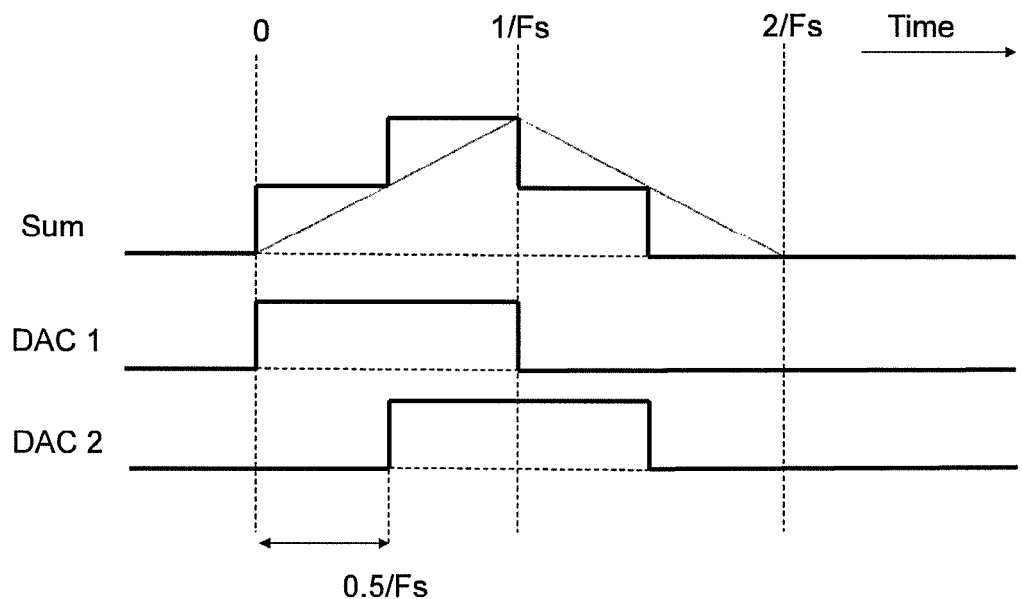
FIG. 3 shows the impulse response of the configuration shown in FIG. 2.

As illustrated in FIG. 3, the two DACs operate on an incoming signal which is a unit impulse input signal at rate Fs. DAC1 23a converts at the sample points whereas DAC2 23b is delayed by a half-sample-period. If each converter is given equal weighting, their natural response is convolved with a double-impulse having a time spacing of 1/(2×Fs), which results in an effective doubling of the reconstruction rate. The summed output is shown in the upper curve of FIG. 3. When this output is fed to an analogue low-pass filter a triangular output results, as shown by the dotted line in the upper curve of FIG. 3.

Thus, the effect of this combination is to provide intermediate reconstruction interpolation points, and the resulting analogue response resembles a system whose impulse response is similar to a triangle function two samples wide at Fs, as shown in FIG. 3. Otherwise, this interpolated response could only be obtained by a single DAC operating at double the Fs rate and a data stream convolved with the triangle in the digital domain.

Figure 4:
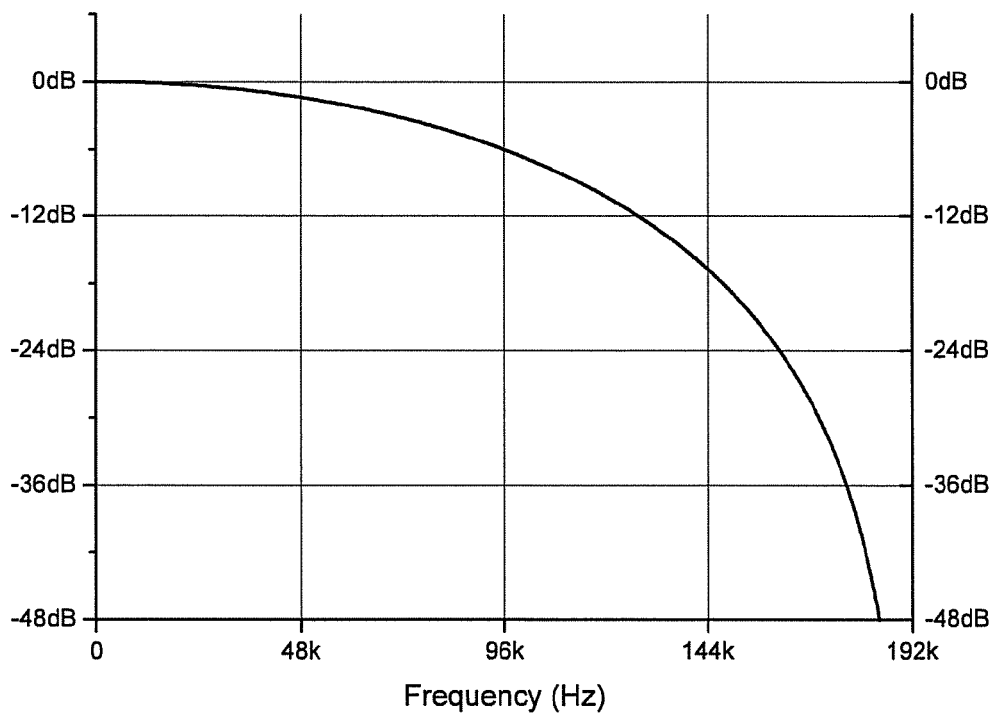
FIG. 4 illustrates the convolving frequency response for the analogue output shown in FIG. 3 when the incoming sample rate is 192 kHz.

As a result, if the two-DAC combination is fed with data at 192 kHz, for example, the resulting analogue response, which is shown in FIG. 4, will have an advantageous null at 192 kHz, while the small 0.12 dB response droop at 20 kHz may be simply corrected in the analogue post-filter.

Figure 5:
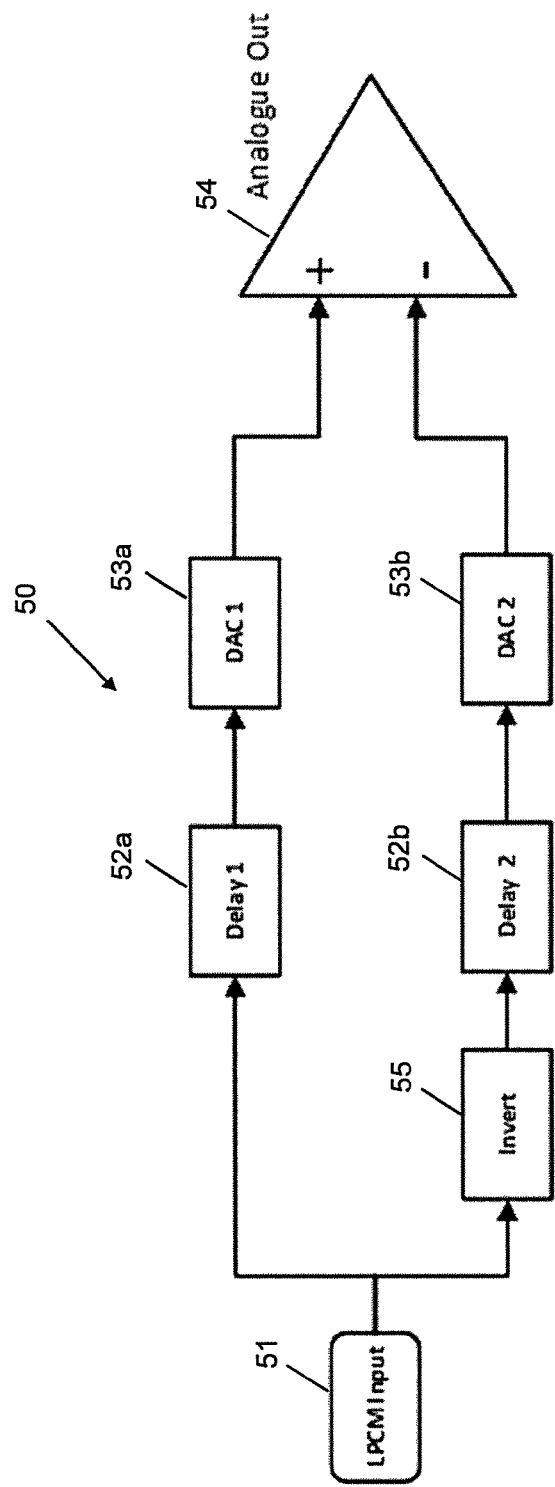
FIG. 5 shows an embodiment of the invention in which two DACs operating on a common input are relatively delayed and their output combined subtractively.

FIG. 5 shows an embodiment of the invention in which two similar DACs, 53a and 53b, are combined into a single conversion system 50 so that their analogue outputs are combined subtractively 54 to produce the final analogue output signal. Both DACs operate on a single incoming data stream at Fs rate. However, the signal to DAC2 53b is inverted by inverter 55 and the signal to each DAC is delayed by a different amount. In some implementations Delay1 52a may be zero whereas Delay2 52b might be 1/(2×Fs). In this case, the data and clocks for one DAC are delayed by a half-sample period relative to the other DAC.

The time and frequency response of this embodiment is identical to the arrangement shown in FIG. 2, but analogue non-linear distortion may be reduced by cancellation resulting from the difference mode.

In alternative arrangements to that shown in FIG. 2, any number of DACs could be combined in a single conversion system so that their analogue outputs are suitably combined. The DACs operate on a single incoming data stream at Fs rate, but the data and clocks for the DACs are delayed by different fractions of the incoming sample period, thereby effectively multiplying the number of reconstruction points by the number of DACs. Thus, N DACs could be combined so that each operates at a sampling instant separated in time by 1/(N×Fs). In these cases the analogue combination could use different weightings for each of the DACs according to their relative delay. For example, some of the DACs might reduce the output signal to sharpen the frequency response.

Figure 6:
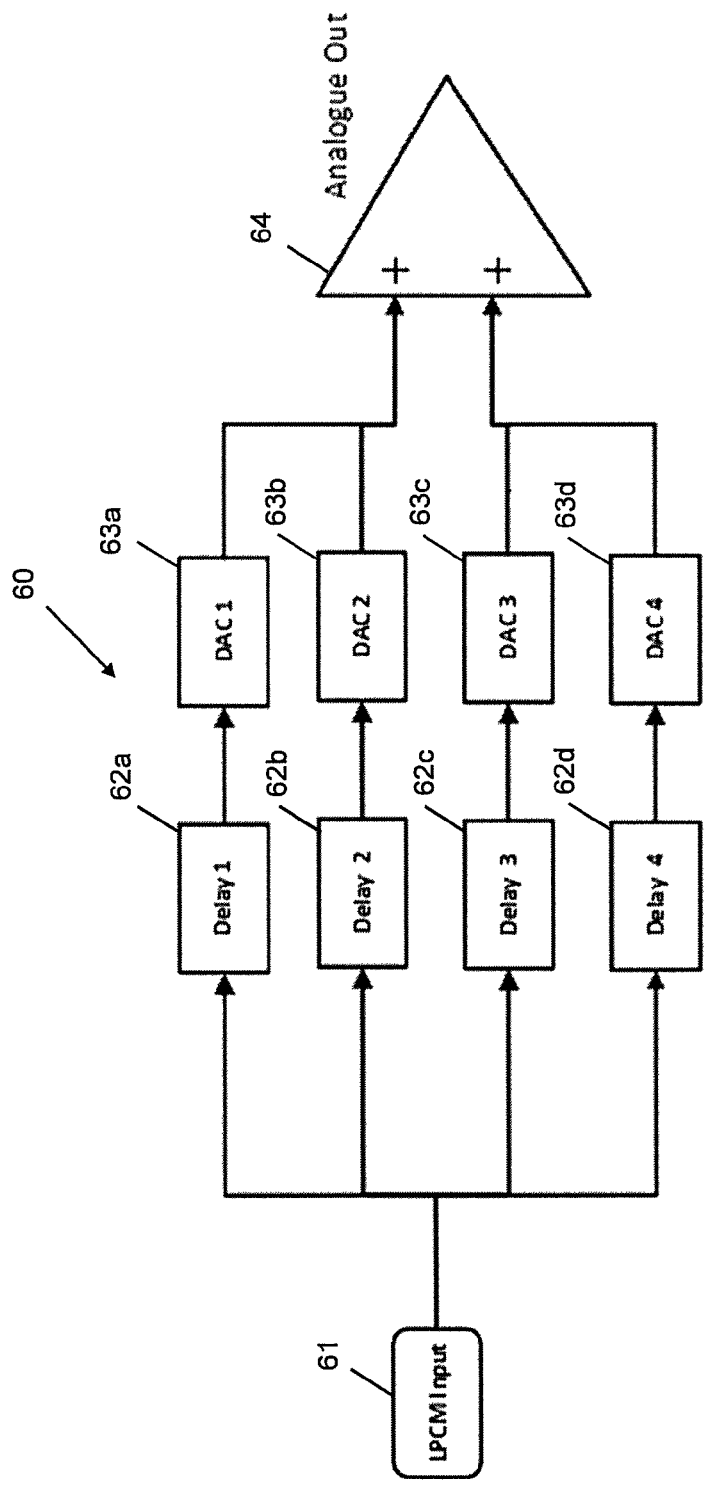
FIG. 6 shows a schematic block diagram of an arrangement in which four DACs operating on a common input are relatively delayed and their output combined additively.

FIG. 6 illustrates such an arrangement in which four DACs 63a-63d are combined in the overall converter device 60. The four DACs operate on a single incoming data stream 61 following respective delays 62a-62d. The analogue outputs of the four DACs 63a-63d are combined additively 64 to produce the final analogue output.

Thus, in some embodiments of the invention multiple pairs of DACs are employed. Specifically, if N DACs are combined in N/2 pairs, then N/2 of the DACs are fed inverted signals and their analogue outputs are subtractively combined with the outputs of the other N/2 DACS that have been fed non-inverted signals. In this embodiment half of the DACs may also delayed by a half-period of the incoming sample rate relative to the others, thereby effectively doubling the number of reconstruction points. It is further noted that the delayed DACs need not be operating in the same signal phase. As an example, where four DACs are used and two DACs operate half a sample delayed from the other two; it may be advantageous for the early and late pairs to operate differentially to achieve more cancellation of high-frequency noise.

Figure 7:
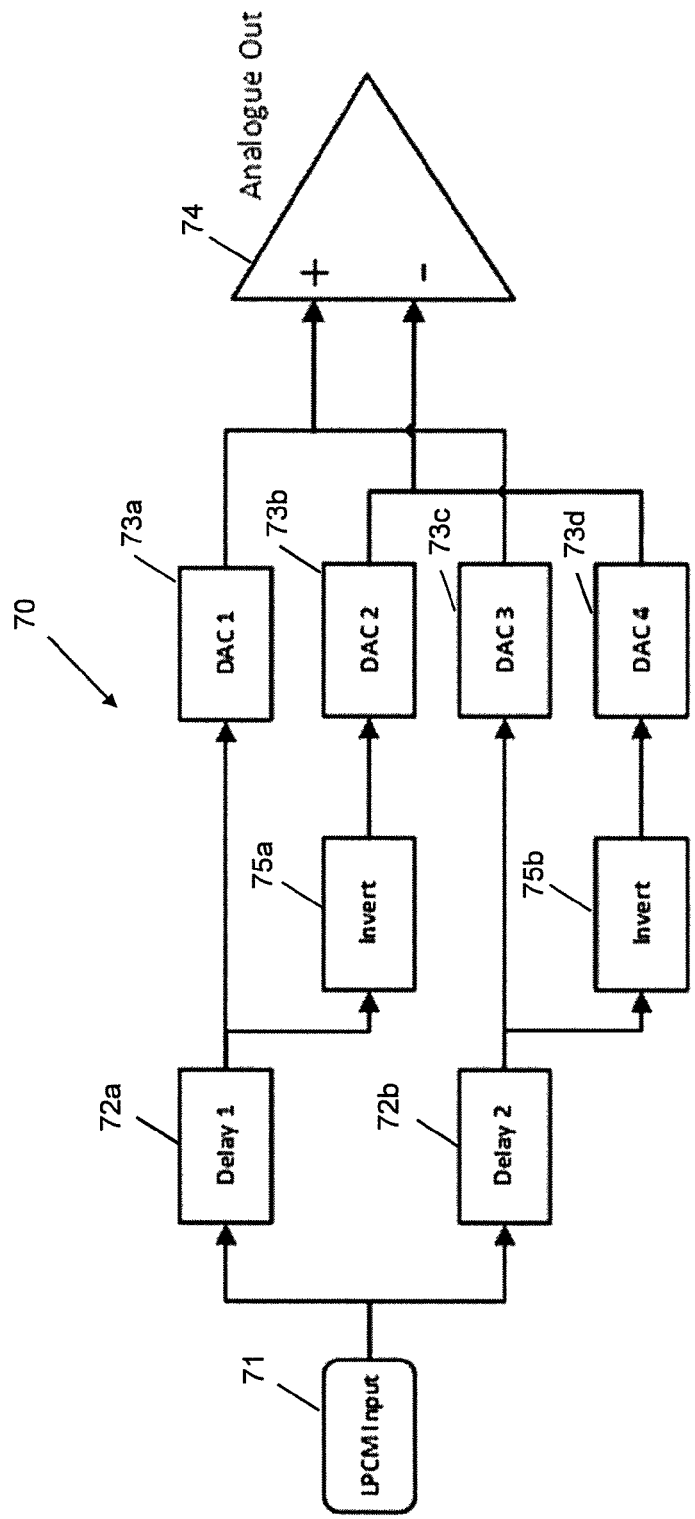
FIG. 7 shows an arrangement in which two pairs of DACs are combined differentially with different time delays between pairs.

FIG. 7 illustrates an arrangement in which four DACs 73a-73d are combined in the overall converter device 70. The four DACs operate on a single incoming data stream 71 at Fs rate. However, the signals to DAC1 73a and DAC2 73b are delayed by an amount 72a which is different than the amount 72b by which the signals to DAC3 73c and DAC4 73d are delayed. Furthermore, the delayed signals to DAC2 73b and DAC4 73d are inverted by inverters 75a and 75b. The analogue outputs from DAC1 73a and DAC3 73c are then combined subtractively 74 with the analogue outputs from DAC2 73b and DAC4 73d to produce the final analogue output signal.

In another embodiment of the invention, where two or multiple pairs of DACs are combined differentially, a common-mode shaped or unshaped random dither signal of two or more least significant bits (LSBs) can be added to the data fed to each subtractive pair. It is expected that this signal will cancel in the analogue domain but its presence within each DAC can improve linearity and cause lower modulation noise errors to be introduced in the overall result.

Figure 8:
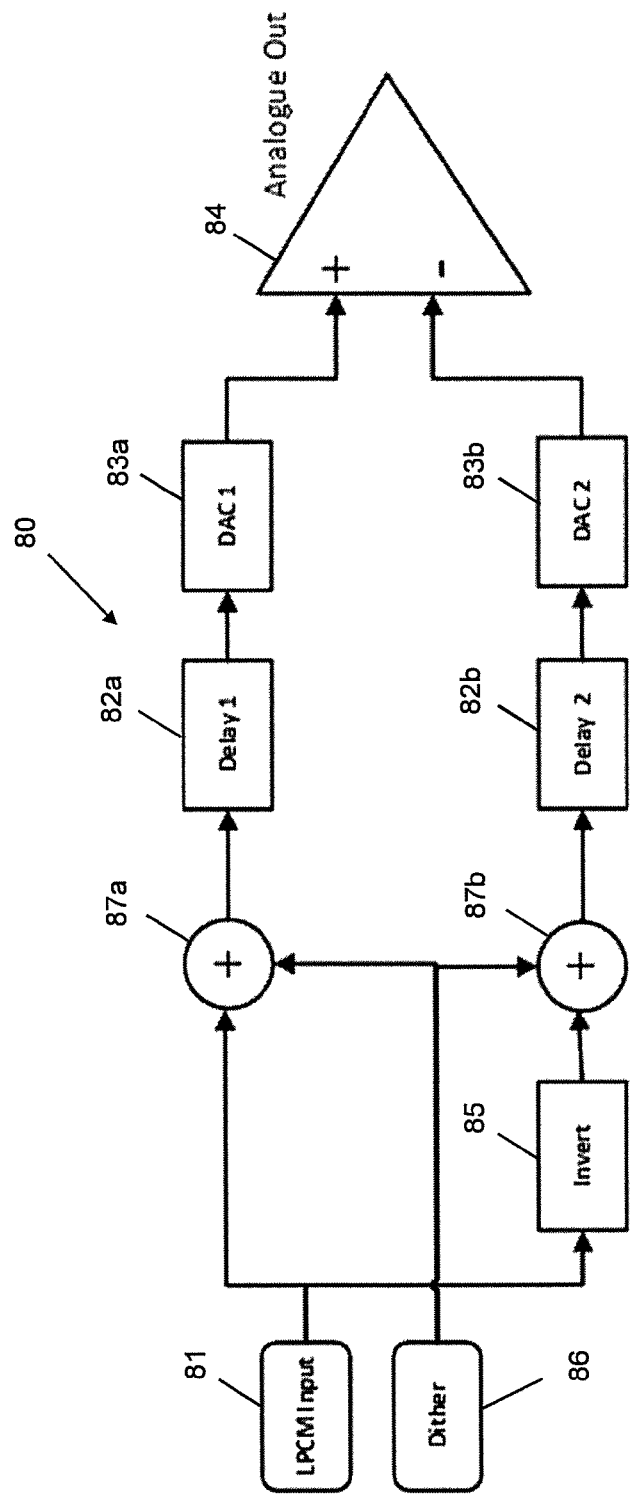
FIG. 8 shows an embodiment of the invention similar to that in FIG. 5, but in which a common mode dither signal is added to the data signal for each DAC prior to delay.

FIG. 8 illustrates such an embodiment in which two similar DACs 83a and 83b are combined in the overall converter device 80 so that their analogue outputs are combined subtractively 84 to produce the final analogue output signal. Both DACs operate on a single incoming data stream 81 at Fs rate. However, the signal to DAC2 83b is inverted by inverter 85 and is then delayed by a time delay 82b, which is different to the time delay 82a applied to the signal to DAC1 83a. In some implementations Delay1 82a may be zero whereas Delay2 82b might be 1/(2×Fs). In this case, the data and clocks for one DAC are delayed by a half-sample period relative to the other DAC. In addition, an amplitude dither signal 86 is added at 87a and 87b to each data signal prior to the delay.

FIG. 8 shows that when DACs are combined differentially a dither signal can be added as shown in such a manner that its effect on the output is reduced by analogue subtraction at low frequencies. The advantage of this configuration is that the signals fed to the delay units are co-temporal.

Figure 9:
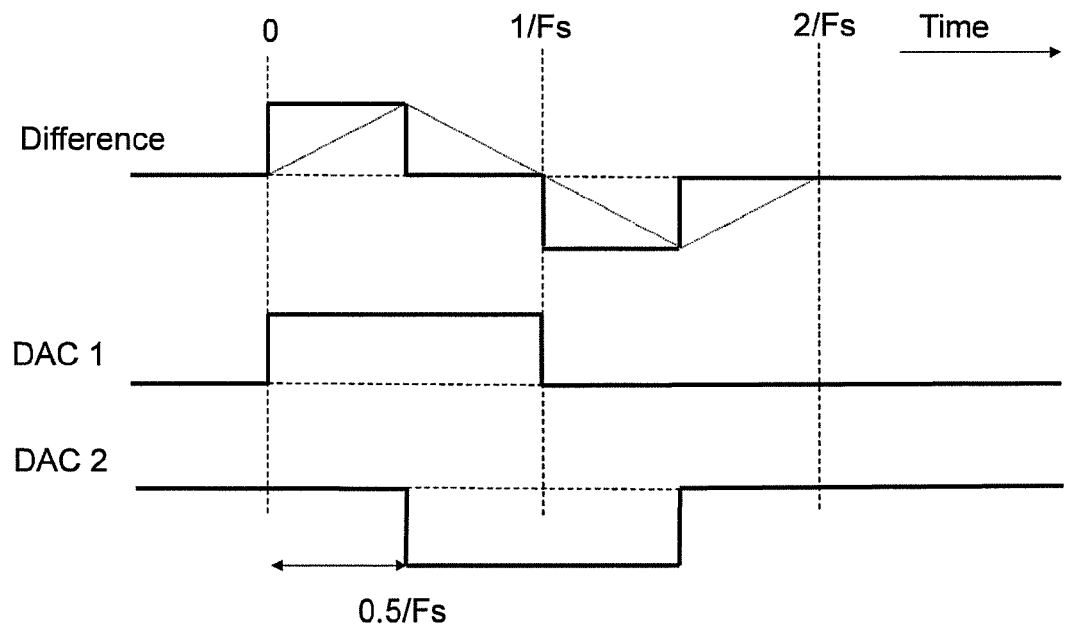
FIG. 9 illustrates the impulse response from the viewpoint of the dither signal in a configuration of the type shown in FIG. 8.

FIG. 9 illustrates the impulse response from the viewpoint of the dither signal in the configuration shown in FIG. 8 where the difference in delay (Delay 2−Delay 1)=1/(2×Fs), i.e. half a sample period. The difference signal is illustrated in the upper curve with the resulting analogue signal indicated by the dotted line.

Figure 10:
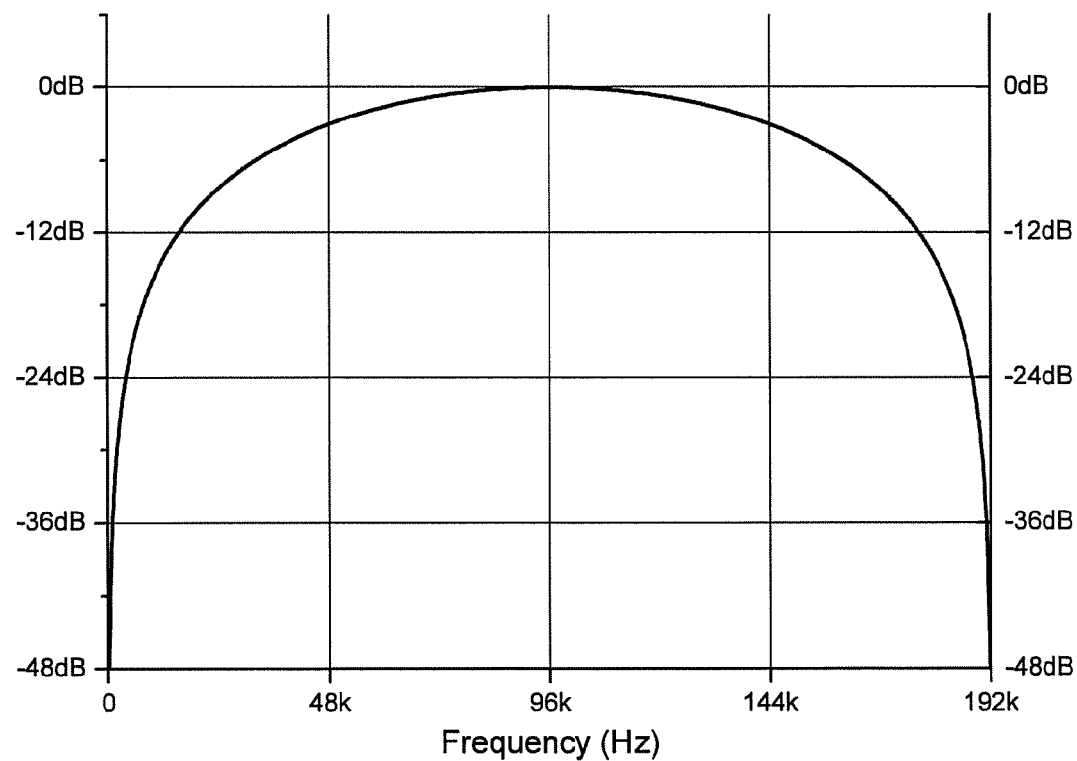
FIG. 10 illustrates the analogue frequency response in respect of the dither signal in the configuration shown in FIG. 8 when the incoming sample rate is 192 kHz.

FIG. 10 illustrates the analogue frequency response in respect of the dither signal in the configuration shown in FIG. 8 for the case where the incoming sample rate is 192 kHz. The degree of degree of cancellation in the frequency domain is apparent.

Figure 11:
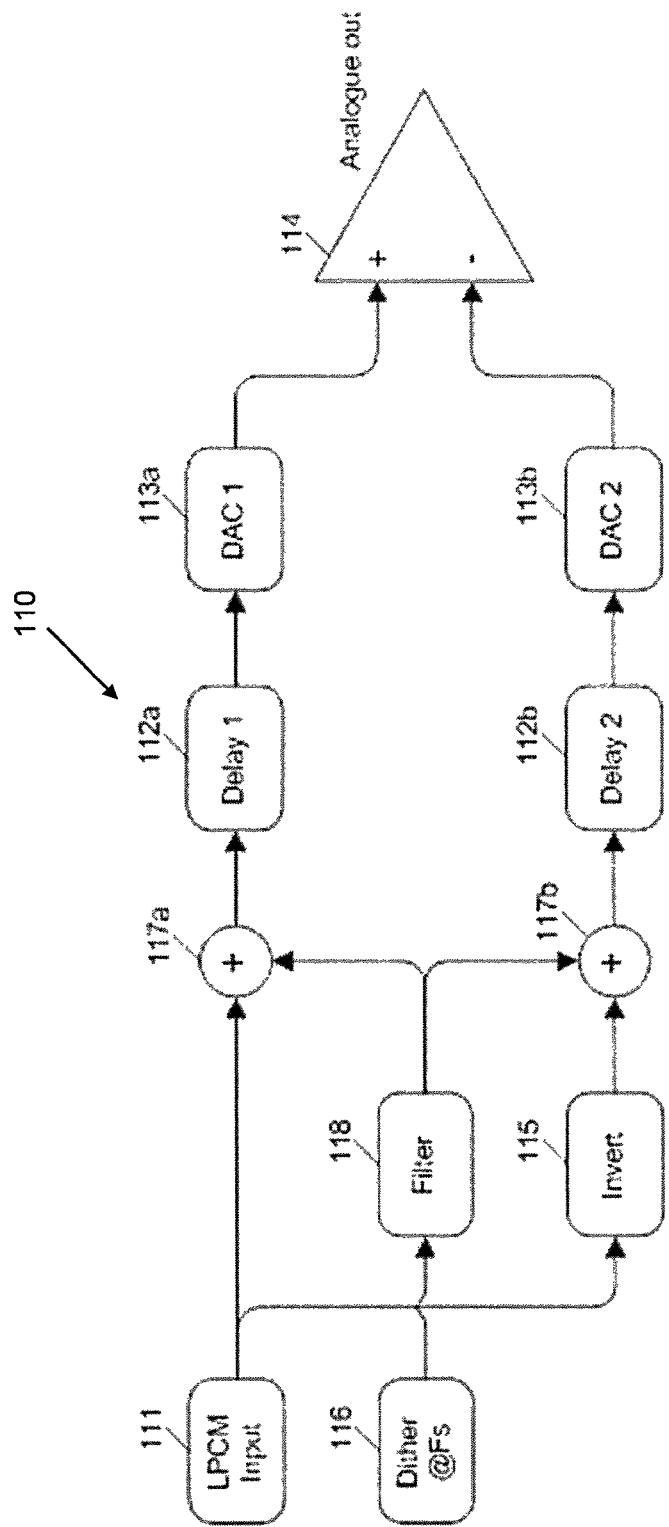
FIG. 11 shows another embodiment of the invention similar to that in FIG. 8, but in which the dither signal is shaped by a filter.

In an enhancement of this embodiment, the Fs rate stream can be shaped so that it contains less high-frequency energy and therefore the loss of high-frequency-cancellation resulting from delayed differencing can be ameliorated. FIG. 11 shows such an arrangement 110. Again two similar DACs 113a and 113b are combined so that their analogue outputs are combined subtractively 114 to produce the final analogue output signal. Both DACs operate on a single incoming data stream 111 at Fs rate and the signal to DAC2 113b is inverted by inverter 115 and is then delayed by a time delay 112b, which is different to the time delay 112a applied to the signal to DAC1 113a. However, in this embodiment, the dither at Fs 116 is shaped by filter 118

Figure 12:
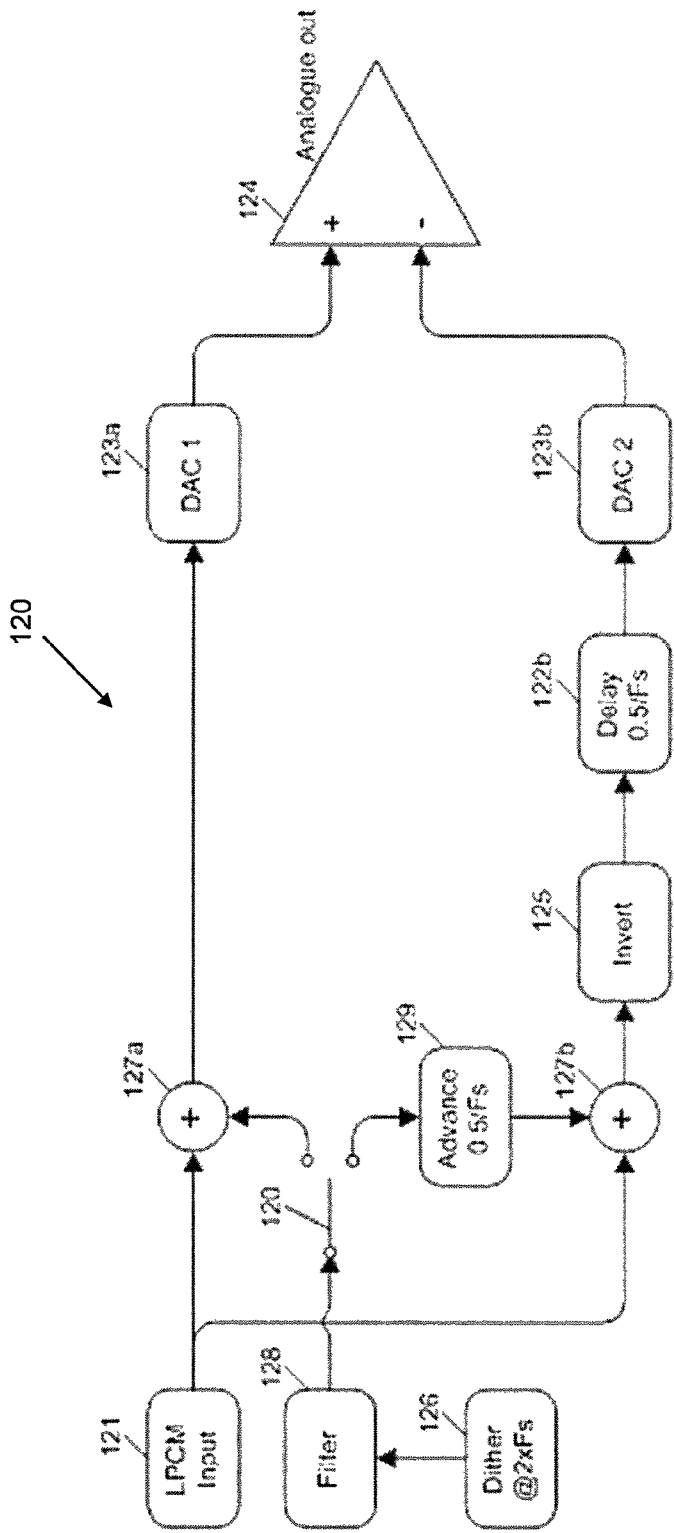
FIG. 12 shows another embodiment of the invention using dither, in which a filtered high rate dither stream is alternately applied to each DAC to give better DAC linearisation for a given output noise spectrum; and,
  FIG. 13 shows another embodiment of the invention using high rate dither, in which a single source of dither sampled at the input PCM sampling rate is fed to each phase of the DACs through different filters.

FIG. 12 illustrates an alternative enhancement of this embodiment 120 in which high rate dither at 2×Fs 126 is shaped by filter 128. Filtered dither is generated at 2×Fs and a switch 120 directs the even samples towards DAC1 123a and the odd samples towards DAC2 123b. An advance operation 129 corresponds to applying the odd sample values to the even sample instants to match to the sample instants of the LPCM input 121. The semi-sample delay operation 122b corresponds to DAC2 123b being clocked on the opposite clock phase to DAC1 123a. The input to DAC2 123b is inverted by inverter 125, and the analogue outputs of the two DACs are combined are combined subtractively 124 to produce the final analogue output signal.

In general, this embodiment features a dither stream generated at a higher rate than the sample rate of the input digital signal (hi-rate dither), typically at the reconstruction rate of the output analogue signal, where samples from the dither stream are sequentially distributed to the DACs on each phase in turn. The filter 128 (whose design is discussed below) establishes relationships between the substreams fed to each DAC phase that allow those substreams to contain large amounts of noise to enhance DAC linearity whilst the residual noise on the analogue output meets allowable limits.

Considering the odd samples of the filtered dither, the time advance and delay operations cancel out and so do the inversion 125 and the inverting input of the analogue balanced to unbalanced conversion 124. Thus, if both DACs are identical, then the same processing happens to both the even samples and the odd samples and the filtered dither appears at the analogue output convolved by the DAC impulse response, despite that it has a higher sample rate than either DAC will accept. Below 0.5 Fs, the frequency response of the DAC will not be material and the main constraint for designing the filter will be the level of tolerable noise on the analogue output.

Above 0.5 Fs, an oversampling DAC will have a stopband. Preferably the filter is designed to allow extra noise in this region since this noise will have the beneficial effect of linearising the DACs but will be attenuated by the DAC stopband before the analogue output. A flash DAC will have a much milder droop towards a single zero at Fs, which gives a smaller but still useful ability to have extra beneficial noise in this region.

Preferably consideration is also given to the possibility of DAC mismatch. The effect of mismatched DACs is to invert the noise spectrum about 0.5 Fs. Thus, the filter design should preferably limit the noise level at frequency Fs-f compared to that at f. For example, with 192 kHz DACs matched to 1%, the filter design should ensure that the noise level at 182 kHz doesn't exceed that at 10 kHz by more than 40 dB.

The benefit of using hi-rate dither in this embodiment is that for a certain level of allowable noise on the analogue output, more noise can be applied to each DAC individually achieving greater linearisation of its defects.

Figure 13:
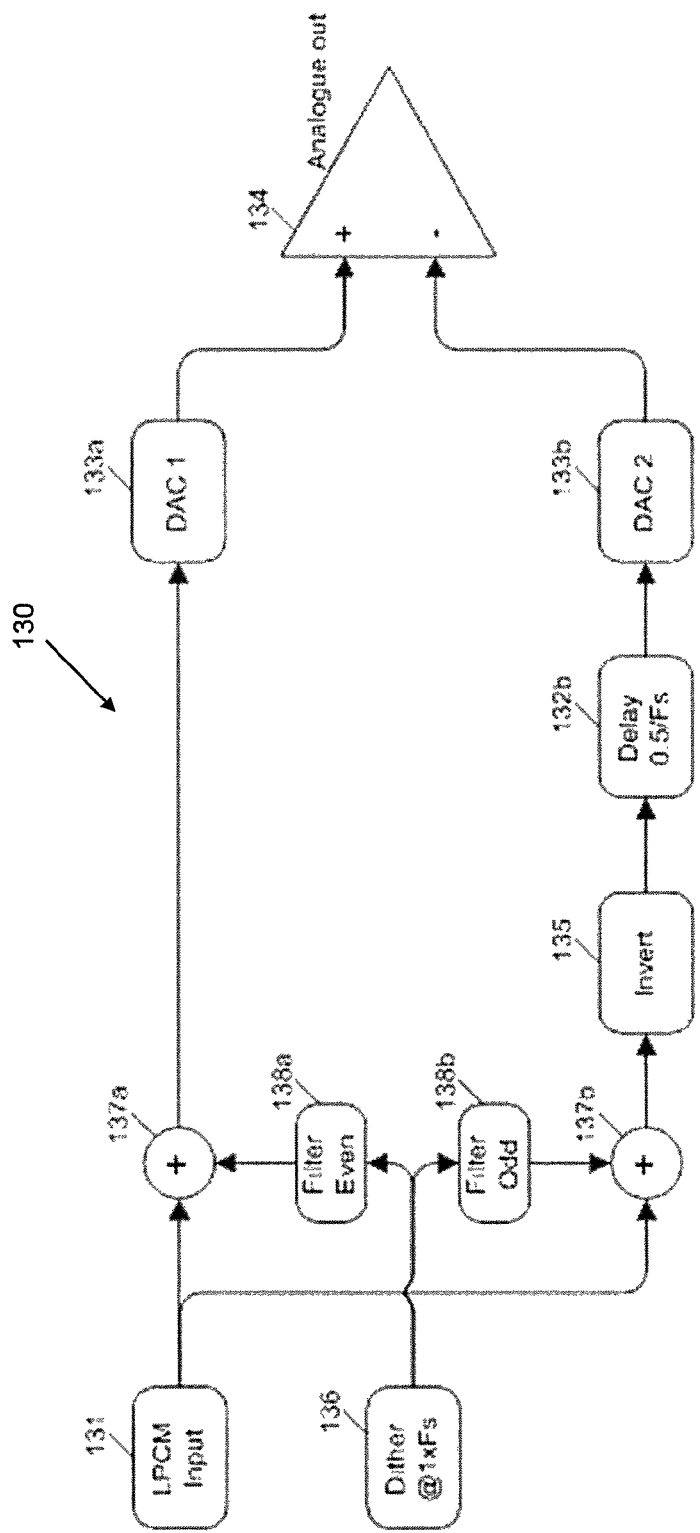

FIG. 13 shows a further development of this embodiment 130, in which dither 136 is initially generated at 1×Fs. It is then passed through filter 138a for application to DAC1 133a and through filter 138b for application to DAC2 133b. The input to DAC2 133b is inverted by inverter 135 and delayed by a time delay 132b. The analogue outputs of the two DACs are combined subtractively 134 to produce the final analogue output signal.

This operation is actually equivalent to the operation in FIG. 12, where the 2×Fs dither generator 126 operates by upsampling the 1× dither generator 136 by interspersing zeros between the sample values. Filter 138a comprises the even taps of the impulse response of filter 128 and filter 138b comprises the odd taps. It is shown as a separate diagram since the arrangement looks quite different despite the underlying close connection. Nevertheless it fits the description of hi-rate dither above.

Design of filters 138a and 138b can thus be performed by the methods outlined above for designing filter 128, and splitting the resultant filter into the even and odd coefficients.

The architecture suggests alternate design methods, such as designing filters 138a and 138b to have the same frequency response but group delay differing by 0.5/Fs over a frequency range. This is equivalent to designing filter 128 to have zero response over that range.

In summary, the present invention provides a new type of composite digital-to-analogue converter device which can be implemented in a number of different configurations according to the particular application. Without loss of generality, the teaching of the embodiments described above may be combined into arbitrarily complex systems. Moreover, as will be appreciated by those skilled in the art, various modifications of the invention are possible based on the foregoing teaching.

The invention claimed is:

1. A digital-to-analogue converter (DAC) device comprising:
   an input for receiving a digital signal having a data sample rate Fs and a sample period 1/Fs;
   N digital-to-analogue converters (DACs) coupled to the input for receiving the digital signal, where N is an even integer and N≥2, and wherein each of the N DACs operates at a frequency of Fs and has an analogue output;
   an inverter coupled to the input and to half of the N DACs, whereby the input digital signal received by said half of the N DACs is inverted relative to the input digital signal received by the other half of the N DACs;
   a delay unit coupled to the input and configured to introduce a relative time delay between the input digital signal received by one or more of the N DACs and the input digital signal received by other of the N DACs, wherein the relative time delay is a fraction of the sample period 1/Fs of the digital signal; and,
   a combiner coupled to the N DACs and configured to combine subtractively the analogue outputs of said half of the N DACS with the analogue outputs of said other half of the N DACs to provide an output analogue signal.

2. A DAC device according to claim 1, wherein the relative time delay between the input digital signal received by said half of the N DACs and the input digital signal received said other half of the N DACs is 1/(2×Fs).

3. A DAC device according to claim 1, wherein the relative time delay between the input digital signals received by each of said half of the N DACs is different and is delayed by 1/(2×Fs) relative to the input digital signals received by corresponding DACs in said other half of the N DACs.

4. A DAC device according to claim 1, wherein the relative time delay between the input digital signal received by said half of the N DACs and the input digital signal received said other half of the N DACs is 1/(N×Fs).

5. A DAC device according to claim 1, wherein the relative time delay between the input digital signals received by each of said half of the N DACs is different and is delayed by 1/(N×Fs) relative to the input digital signals received by corresponding DACs in said other half of the N DACs.

6. A DAC device according to claim 1, wherein at least one DAC has no other DAC with the same time delay from the input digital signal.

7. A DAC device according to claim 1, further comprising a dither unit coupled to the input and the N DACs, the dither unit configured to generate a random dither signal for adding to the input digital signal received by each of the N DACs.

8. A DAC device according to claim 7, wherein the dither signal is a shaped dither signal.

9. A DAC device according to claim 7, wherein the dither signal comprises two or more least significant bits (LSBs).

10. A DAC device according to claim 7, wherein the dither signal is generated at a rate higher than the sample rate of the input digital signal.

11. A DAC device according to claim 10, wherein the dither signal is generated by upsampling a lower rate dither sequence.

12. A DAC device according to claim 10, wherein the dither signal is generated at a reconstruction rate of the output analogue signal and is fed to each set of DACs in sequence.

13. A DAC device according to claim 7, wherein the dither signal is filtered with a different filter for each time delay of the N DACs.

14. A DAC device according to claim 7, wherein the input digital signal is noise shaped so as to contain less energy at higher frequencies.

15. A DAC device according to claim 1, wherein the combiner is configured to combine the analogue outputs of each of the N DACs with an applied weighting.

16. A DAC device according to claim 15, wherein the applied weighting is the same for each analogue output.

17. A DAC device according to claim 15, wherein the applied weighting is different for at least two of the N DACs.

18. A DAC device according to claim 15, wherein the applied weighting is dependent on the relative time delay of the input digital signal received by each respective DAC.

19. A DAC device according to claim 1, wherein the digital signal comprises a digital audio signal.

20. A DAC device according to claim 19, wherein the digital audio signal is pulse code modulated (PCM) signal.

21. A method for converting a digital signal to an analogue signal, the method comprising the steps of:
receiving the digital signal having a data sample rate Fs and a sample period 1/Fs;
feeding the digital signal to N digital-to-analogue converters (DACs) operating at a frequency of Fs and having an analogue output, wherein N is an even integer and N≥2, such that the input digital signal received by half of the N DACs is inverted relative to the input digital signal received by the other half of the N DACs and such that there is a relative time delay between the input digital signal received by one or more of the N DACs and the input digital signal received by other of the N DACs, wherein the relative time delay is a fraction of the sample period 1/Fs of the digital signal; and,
combining subtractively the analogue outputs of said half of the N DACS with the analogue outputs of said other half of the N DACs to provide the output analogue signal.

* * * * *